US008445178B2

(12) United States Patent
Park et al.

(10) Patent No.: US 8,445,178 B2
(45) Date of Patent: May 21, 2013

(54) COMPOSITION FOR RADICAL POLYMERIZATION AND METHOD OF FORMING PATTERN USING THE COMPOSITION

(75) Inventors: Jong-jin Park, Yongin-si (KR); Kwang-hee Lee, Suwon-si (KR); Xavier Bulliard, Yongin-si (KR); Yun-hyuk Choi, Seoul (KR); Kwang-sup Lee, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 427 days.

(21) Appl. No.: 12/479,151

(22) Filed: Jun. 5, 2009

(65) Prior Publication Data

US 2010/0119976 A1 May 13, 2010

(30) Foreign Application Priority Data

Nov. 11, 2008 (KR) .................. 10-2008-0111862

(51) Int. Cl.
*G03F 7/00* (2006.01)
*G03F 7/004* (2006.01)
*G03F 7/40* (2006.01)
*G03F 7/027* (2006.01)

(52) U.S. Cl.
USPC .......... 430/286.1; 430/270.1; 430/281.1; 430/311; 430/913; 430/914; 430/921; 430/331; 430/322; 430/326

(58) Field of Classification Search ........... 430/270.1, 430/281.1, 286.1, 913, 914, 927, 311
See application file for complete search history.

(56) References Cited

U.S. PATENT DOCUMENTS

| 4,959,297 | A | * | 9/1990 | Palazzotto | 430/322 |
| 5,322,912 | A | * | 6/1994 | Georges et al. | 526/204 |
| 5,500,453 | A | * | 3/1996 | Toba et al. | 522/25 |
| 5,639,880 | A | * | 6/1997 | Muller et al. | 544/173 |
| 5,907,001 | A | * | 5/1999 | Foucher et al. | 522/114 |
| 5,932,393 | A | * | 8/1999 | Cunningham et al. | 430/281.1 |
| 6,033,829 | A | * | 3/2000 | Yamada et al. | 430/281.1 |
| 6,080,714 | A | * | 6/2000 | Overkempe et al. | 510/433 |
| 6,852,766 | B1 | | 2/2005 | DeVoe | |
| 6,929,828 | B2 | * | 8/2005 | Baudin et al. | 427/493 |
| 7,005,229 | B2 | * | 2/2006 | Nirmal et al. | 430/270.1 |
| 7,060,419 | B2 | | 6/2006 | Bentsen et al. | |

(Continued)

FOREIGN PATENT DOCUMENTS

KR    10-2007-0007261    1/2007

OTHER PUBLICATIONS

Dong-Yol Yang et al., "Ultraprecise microreproduction of a three-dimensional artistic sculpture by multipath scanning method in two-photon photopolymerization", Applied Physics Letters, 2007, vol. 90, pp. 013113-1 to 013113-3.

(Continued)

*Primary Examiner* — Amanda C. Walke
(74) *Attorney, Agent, or Firm* — Cantor Colburn LLP (57) ABSTRACT

A composition for radical polymerization includes a photosensitive material, a photoinitiator, a solvent, and a material for adjusting a size of a pattern. A method of forming a pattern using the composition is also disclosed.

12 Claims, 4 Drawing Sheets

U.S. PATENT DOCUMENTS

| | | | | |
|---|---|---|---|---|
| 7,081,494 B2* | 7/2006 | Fujita et al. | | 524/543 |
| 7,265,161 B2 | 9/2007 | Leatherdale et al. | | |
| 7,285,372 B2* | 10/2007 | Baumann et al. | | 430/273.1 |
| 7,605,285 B2* | 10/2009 | Kobayashi et al. | | 558/277 |
| 7,781,495 B2* | 8/2010 | Okada et al. | | 522/178 |
| 7,821,096 B2* | 10/2010 | Usami | | 257/499 |
| 7,981,577 B2* | 7/2011 | Fujimori | | 430/7 |
| 2006/0274423 A1* | 12/2006 | Fukushige et al. | | 359/659 |
| 2009/0292044 A1* | 11/2009 | Kawazura et al. | | 523/152 |

OTHER PUBLICATIONS

Sang Hu Park et al., "Fabrication of a bunch of sub-30-nm nanofibers inside microchannels using photopolymerization via a long exposure technique", Applied Physics Letters, 2006, vol. 89, pp. 173133-173133-3.

"Finer Features for Functional Microdevices", Nature, Aug. 16, 2001, vol. 412, pp. 697-698.

* cited by examiner

COMPOSITION FOR RADICAL POLYMERIZATION AND METHOD OF FORMING PATTERN USING THE COMPOSITION

CROSS-REFERENCE TO RELATED APPLICATIONS

This application claims priority to Korean Patent Application No. 10-2008-0111862, filed on Nov. 11, 2008, and all the benefits accruing therefrom under 35 U.S.C. 119, the contents of which in its entirety are herein incorporated by reference.

BACKGROUND

1. Field

The present disclosure is directed to a composition for radical polymerization and a method of forming a pattern using the composition, and more particularly, to a composition for radical polymerization including a material for adjusting the size of a pattern and a method of forming a pattern using the compound, whereby the size of the pattern can be adjusted.

2. Description of the Related Art

Radical polymerization, which is a common polymerization method, proceeds by generation and propagation of monomers in a free radical state, in which a terminal atom of a propagating polymer has a free electron. Because of the reactivity of these free radical terminal groups in radical polymerization, it is relatively easy to adjust molecular weight of a polymer, or predict the composition of a copolymer.

As various kinds of electrical devices have become thinner and more miniaturized with advances in microfabrication of such devices, microfabrication of sub-micrometer sized patterns has received renewed attention. In particular, forming of such sub-micrometer sized patterns may be performed using a radical polymerization mechanism involving light exposure and developing processes. By such methods, the sub-micrometer sized patterns can be mass-produced at low costs.

In microfabrication fields however, patterns with various sizes are required according to their application. While sub-micron patterns may be obtainable, there remains a need to develop a method of readily adjusting the size of a pattern obtained by radical polymerization, using a simple process.

SUMMARY

In an embodiment, a composition for radical polymerization has a composition allowing for adjustment of the size of a pattern.

In another embodiment, a method of forming a pattern with the composition for radical polymerization is provided.

Additional aspects will be set forth in part in the description which follows and, in part, will be apparent from the description, or may be learned by practice of the invention.

In an embodiment, a composition for radical polymerization includes a photosensitive material, a photoinitiator, a solvent, and a material for adjusting a size of a pattern.

The material for adjusting the size of a pattern may be a radical scavenger.

The material for adjusting the size of a pattern may comprise at least one material selected from the group consisting of a polymer-containing radical scavenger, a photosensitizer, and any combination thereof.

In another embodiment, a method of forming a pattern includes preparing a first composition for radical polymerization which including a photosensitive material, a photoinitiator, a solvent, and a material for adjusting a size of a pattern; applying the first composition for radical polymerization on a substrate to form a first film; irradiating the first film with light having a first energy according to a first pattern, to selectively expose the first film; and developing the light-exposed first film to obtain the first pattern.

Where a radical scavenger is included as the material for adjusting the size of the pattern, the size of the first pattern is adjusted to be smaller than the size of a second pattern, wherein the second pattern is obtained by applying, to a surface of a substrate, a second composition for radical polymerization which includes a photosensitive material, a photoinitiator, and a solvent, where each of these components is present in the same weight ratio as the corresponding components in the first composition for radical polymerization, to obtain a second film with the same thickness as that of the first film, then irradiating the second film with light having a first energy according to the first pattern, to selectively expose the second film; and developing the light-exposed second film to obtain a second pattern.

Where at least one component selected from the group consisting of a polymer-containing radical scavenger, a photosensitizer, and any combination thereof, as the material for adjusting the size of the pattern of the first composition for radical polymerization, the size of the first pattern is adjusted to be larger than a size of the second pattern, wherein the second pattern is obtained by applying, to a surface of a substrate, a second composition for radical polymerization which includes a photosensitive material, a photoinitiator, and a solvent, where each of these components is present in the same weight ratio as the corresponding components in the first composition for radical polymerization, to obtain a second film with the same thickness as the that of the first film, then irradiating the second film with light having a first energy according to the first pattern, to selectively expose the second film; and developing the light-exposed second film to obtain a second pattern.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Thus, a composition for radical polymerisation, according to an embodiment, includes a photosensitive material, a photoinitiator, a solvent, and a material for adjusting a size of a pattern.

The term "composition for radical polymerization" used herein refers to a composition which can form a cured material such that crosslinking and/or curing are performed by a radical polymerization mechanism during exposure to light.

The photosensitive material has at least one photosensitive functional group that can be involved in crosslinking and/or curing reactions by radical polymerization during exposure to light. Exemplary photosensitive materials may include, but are not limited to, a multi-functional acrylate-based compound that contains at least one of an acryl group and a vinyl group, a multi-functional polyalkyleneoxide, and a polysiloxane-based polymer.

Exemplary photosensitive materials include urethane acrylate, allyloxylated cyclohexyl diacrylate, bis(acryloxy ethyl) hydroxyl isocyanurate, bis(acryloxy neopentylglycol)adipate, bisphenol A diacrylate, bisphenol A dimethacrylate, 1,4-butanediol diacrylate, 1,4-butanediol dimethacrylate, 1,3-butyleneglycol diacrylate, 1,3-butyleneglycol dimethacrylate, dicyclopentanyl diacrylate, diethyleneglycol diacrylate, diethyleneglycol dimethacrylate, dipentaerythritol hexaacrylate, dipentaerythritol monohydroxy pentaacrylate, di(trimethylolpropane) tetraacrylate, ethyleneglycol dimethacrylate, glycerol methacrylate, 1,6-hexanediol diacrylate, neopentylglycol dimethacrylate, neopentylglycol hydroxypivalate diacrylate, pentaerythritol triacrylate, pentaerythritol tetraacrylate, phosphoric acid dimethacrylate, polyethyleneglycol diacrylate, polypropyleneglycol diacrylate, tetraethyleneglycol diacrylate, tetrabromobisphenol A diacrylate, triethyleneglycol divinylether, triglycerol diacrylate, trimethylolpropane triacrylate, tripropyleneglycol diacrylate, tris(acryloxyethyl)isocyanurate, phosphoric acid triacrylate, phosphoric acid diacrylate, acrylic acid propargyl ester, vinyl terminated polydimethylsiloxane, vinyl terminated diphenylsiloxane-dimethylsiloxane copolymer, vinyl terminated polyphenylmethylsiloxane, vinyl terminated trifluoromethylsiloxane-dimethylsiloxane copolymer, vinyl terminated diethylsiloxane-dimethylsiloxane copolymer, vinylmethylsiloxane, monomethacryloyloxypropyl terminated polydimethyl siloxane, monovinyl terminated polydimethyl siloxane, and monoallyl-mono trimethylsiloxy terminated polyethylene oxide. Combinations of the foregoing may be used.

The photoinitiator initiates the crosslinking and/or curing reactions of the photosensitive material during exposure to light. The photoinitiator may be an acetophenone-based, benzoin-based, benzophenone-based, or thioxanthenone-based photoinitiator, or any combination thereof. Exemplary acetophenone-based initiators may include 4-phenoxy dichloroacetophenone, 4-t-butyl dichloroacetophenone, 4-t-butyl trichloroacetophenone, 2,2-diethoxyacetophenone, 2-hydroxy-2-methyl-1-phenyl-propane-1-one, 1-(4-isopropylphenyl)-2-hydroxy-2-methyl-propane-1-one, 1-(4-dodecylphenyl)-2-hydroxy-2-methylpropane-1-one, 4-(2-hydroxyethoxy)-phenyl-(2-hydroxy-2-propyl)ketone, 1-hydroxy cyclohexyl phenyl ketone, 2-methyl-1-[4-(methylthio)phenyl]-2-morpholino-propane-1, or a combination thereof, but is not limited thereto. The benzoin-based photoinitiator may be benzoin, benzoin methyl ether, benzoin ethyl ether, benzoin isopropyl ether, benzoin isobutyl ether, benzyl dimethyl ketal, or a combination thereof, but is not limited thereto. The benzophenone-based photoinitiator may be benzophenone, benzoyl benzoic acid, benzoyl benzoic acid methyl ester, 4-phenyl benzophenone, 4-hydroxy benzophenone, 4-benzoyl-4'-methyl diphenyl sulphide, 3,3'-dimethyl-4-methoxy benzophenone, or a combination thereof, but is not limited thereto.

A weight ratio between the amount of the photosensitive material and the photoinitiator not particularly limited, and may be appropriately selected according to properties required for a desired pattern and a performance of the photoinitiator. In an embodiment, the photosensitive material and the photoinitiator are present in a weight ratio of 99.99:0.01 to 70:30.

The solvent may be selected from solvents that are commonly used in association with curing reactions by a radical polymerization mechanism. The solvent includes at least one selected from the group consisting of dimethyl formamide ("DMF"), 4-hydroxy-4-methyl-2-pentanone, ethylene glycol monoethyl ether, 2-methoxyethanol, chloroform, chlorobenzene, toluene, tetrahydrofuran, dichloromethane, hexane, heptane, octane, nonane, decane, and any combination thereof, but is not necessarily limited thereto.

The material for adjusting the size of a pattern may be a radical scavenger.

The term "material for adjusting a size of a pattern" used herein refers to a material that can change the size of a pattern, for example, the thickness, length, width, and/or diameter of the pattern, obtained by selectively exposing a film of the composition for radical polymerization to light and developing the selectively exposed composition, with respect to the size of a pattern obtained by selectively exposing to light a composition that does not include the material for adjusting the size of the pattern and developing the selectively exposed composition.

The radical scavenger limits or prevents diffusion of a radical produced when the composition for radical polymer- ization described above is exposed to light, thereby allowing the size of the pattern formed to be smaller than the size of a comparative pattern that can be formed from a comparative composition that has the same composition as the inventive composition for radical polymerization, with identical components present in the same amount as those of the inventive composition for radical polymerization that includes the radical scavenger, except that the comparative composition for radical polymerization does not include the radical scavenger.

Exemplary radical scavengers may include, but are not limited to, 2,2,6,6-tetramethyl-1-piperidinyloxy free radical ("TEMPO") represented by Formula 1 below; isoprene; diisobutylene; tocopherols, including α-tocopherol, β-tocopherol, γ-tocopherol, δ-tocopherol, and derivatives thereof; 4,6-bis(octylthiomethyl)-o-cresol; 4,6-bis(dodecylthiomethyl)-o-cresol, and derivatives thereof; 4,4'-thiobis(2-methyl-6-t-butylphenol), 4,4'-thiobis(2-t-butyl-5-methylphenol), 2,2'-thiobis(6-t-butyl-4 methylphenol), 2,2'-thiobis 4-octyl phenol, 4,4'-thiobis(2-t-butyl-5-methylphenol), and derivatives thereof; triethylene glycol bis[3-[3,5-t-butyl-4-hydroxy-5-methylphenyl)propionate and derivatives thereof; 1,3,5-tris(4-tert-butyl-3-hydroxy-2,6-dimethylbenzyl)-1,3,5-triazine-2,4,6-(1H,3H,5H)-trione, and derivatives thereof; 2,5-di-t-amylhydroquinone and derivatives thereof; a reaction product of 4-methylphenol with dicyclopentadiene and isobutylene, and derivatives thereof; oxidized bis(hydrogenated tallow alkyl)amine, and derivatives thereof; bis-(1-octyloxy-2,2,6,6 tetramethyl-4-piperidinyl)sebacate, and derivatives thereof; 4,4'-bis(α,α-dimethylbenzyl)diphenylamine, N-phenyl-styrenated benzenamine, a reaction product of diphenylamine and acetone, p-(p-toluene-sulfonyl amido)-diphenylamine, and mixtures thereof; 2,2-thiodiethylene bis[3-t-butyl-4-hydroxy-5 methylphenyl)propionate]; 2,2-thiodiethylene bis[3(3,5-di-methyl-4-hydroxyphenyl)propionate], and derivatives thereof; and galvinoxyl free radical represented by Formula 2 below; and any combination thereof.

Formula 1

Formula 2

In addition, the material for adjusting the size of the pattern may be at least one selected from the group consisting of a polymer-containing radical scavenger, a photosensitizer, and any combination thereof.

The polymer-containing radical scavenger is a material in which a polymer is combined with the radical scavenger described above. The polymer-containing radical scavenger interferes with the function of a diffusible (non-polymeric) radical scavenger that prevents the diffusion of the radical during exposure to light, and as a result, contributes to the diffusion of the radical. Thus, the polymer-containing radical scavenger allows the size of the pattern formed to be greater than a size of a pattern that can be obtained from a comparative composition for radical polymerization of the same composition and with components in the same amount as those of the composition for radical polymerization including the polymer-containing radical scavenger, except that the comparative composition for radical polymerization does not include the polymer-containing radical scavenger.

In addition, the photosensitizer may increase the diffusion of the radical during exposure to light. Thus, the photosensitizer allows the size of the pattern formed to be larger than the size of a pattern that can be obtained from a comparative composition for radical polymerization that has the same composition and with components in the same amount as those of the composition for radical polymerization including the photosensitizer, except that the comparative composition for radical polymerization does not include the photosensitizer.

The polymer-containing radical scavenger may be a material in which the radical scavenger described above is combined with a polymer, where the combination can inhibit the function of the radical scavenger.

Exemplary polymers include, but are not limited to, polystyrene, poly(methyl)methacrylate, polymethacrylate, polyacrylate, poly(methyl)acrylate, derivatives of, and combinations thereof. The weight average molecular weight ($M_w$) of the polymer may be about 1,000 to about 10,000 g/mol, but is not limited thereto.

In addition, the photosensitizer may be selected from known materials which can increase the diffusion of the radical.

The photosensitizer may be at least one selected from the group consisting of Michler's ketone represented by Formula 3 below, a colorant, an organic acid, an organic acid salt, an organic amine, a triarylmethane-based material, a thiol-group-containing hetero aromatic-based material, a metal complex, and combinations thereof, but is not limited thereto.

Formula 3

Exemplary photosensitizers include, but are not limited to, Michler's ketone, tar colorants, potassium or sodium salts of chlorophylline, riboflavine or derivatives thereof, water-soluble annatto, $CuSO_4$, caramel, curcumine, cochineal, citric acid, ammonium citrate, sodium citrate, glycolic acid, oxalic acid, potassium tartrate, sodium tartrate, ascorbic acid, formic acid, triethanolamine, monoethanolamine, malic acid, tri(dimethylaminophenyl)methane, tri(diethylaminophenyl)methane, tri(4-diethylaminophenyl)methane, triacetylaminophenylmethane, triethylaminophenylmethane, trimethylaminophenyl methane, mercapto benzoxazole, 2-mercapto benzoxazole, mercapto-5-methyl benzoxazole, mercapto imidazole, mercapto-5-methyl imidazole, mercapto thiazole, mercapto-5-methyl thiazole, mercapto selenazole, mercapto- 5-methyl selenazole; metal complexes, such as RuL$_2$(SCN)$_2$, RuL$_2$(H$_2$O)$_2$, RuL$_3$, RuL$_2$, OsL$_3$, and OsL$_2$ where L is at least one of 2,2'-bipyridyl-4,4'-dicarboxylate and 2,2'-bipyridine; and combinations thereof.

The composition for radical polymerization may further include a quantum dot. The quantum dot can have an average particle size of several nanometers, and exhibits unique characteristics, that is, quantum effects. In addition, the quantum dot is known to be used in semiconductor structures for producing high efficiency light emitting devices and luminescent labeling of molecules in a living body. In an embodiment, the quantum dot has an average particle size of 1 to 100 nm, specifically 1 to 20 nm.

Thus, a pattern obtained from the composition for radical polymerization may further include a quantum dot, and thus can be used in a variety of electrical and electrooptical devices.

The quantum dot may be a known quantum dot synthesized using any known synthesis method of quantum dots. For example, the quantum dot may be any quantum dot prepared from a metal precursor by chemical wet etching. For instance, in an exemplary method, the quantum dot may be prepared by injecting a metal precursor into an organic solvent, in the presence of a dispersant in some cases, and growing crystals at a constant temperature, but the preparation of the quantum dot is not limited thereto.

The quantum dot may be a quantum dot of a group II-IV element, a group III-IV element, r a group V group, or mixtures thereof. The quantum dot may be a quantum dot of CdS, CdSe, CdTe, ZnS, ZnSe, ZnTe, HgS, HgSe, HgTe, GaN, GaP, GaAs, InP, or InAs, but is not limited thereto. If necessary, mixtures of at least two quantum dots described above may also be used. For example, the quantum dot may be a quantum dot mixture in which at least two quantum dots are simply mixed, a quantum dot with a mixed crystalline structure in which at least two compound are partially separated in the same crystal, such as crystals with a core-shell structure or crystals with a gradient structure, a quantum dot comprising an alloy of at least two nanocrystal compounds, at least two quantum dots of different sizes, or a combination of these.

The composition for radical polymerization may further include a two photon absorption material.

The two photon absorption material is included in the composition for radical polymerization, thereby inducing a curing reaction by two-photon absorption. The two-photon absorption is a process where two photons of light are absorbed only in an illumination area of very high peak power of a light beam. Thus, in the curing reaction by the two-photon absorption, the curing process occurs only in part of a region where the light beam is focused, and accordingly, excellent accuracy, for example, exposure accuracy to a level of tens of nanometers can be obtained. In addition, the amount of light absorption can be secondarily increased by the two-photon absorption by adjusting the intensity of incident light, and thus, although a focus point of the incident light is formed inside a target to be exposed to light, the light absorption amount does not decrease. Accordingly, even molecules inside the subject to be exposed to light may be excited selectively. In this way, very precise 3-dimensional patterns can be formed using the two-photon absorption.

The two photon absorption material may be selected from known materials which can induce a curing reaction by the two-photon absorption.

Exemplary two photon absorption materials include, but are not limited to, a cyanine-based material, a merocyanine-based material, an oxonol-based material, a phthalocyanine-based material, an azo-based material, a fluorene-based material, a thiophene-based material, a diphenylethene-based material, a phenoxazine-based material, or a combination thereof.

Examples of the two photon absorption material may include compounds represented by Formulae 4 through 9 below, but are not limited thereto:

Formula 4

Formula 5

Formula 6

Formula 7

Formula 8

Formula 9

In Formulae 4 through 8, $Z_1$ through $Z_{20}$ are each independently a $C_1$-$C_{10}$ alkyl group or a $C_6$-$C_{14}$ aryl group.

The compounds of Formulae 4 through 8 are as follows, but are not limited thereto:

The compound of Formula 9 is referred to as Rodamine B.

In another embodiment, a method of forming a pattern may include: preparing a first composition for radical polymerization including the photosensitive material, the photoinitiator, the solvent, and the material for adjusting the size of the pattern; applying the first composition for radical polymerization to a surface of a substrate to form a first film; irradiating the first film with light having a first energy according to a first pattern, to selectively expose the first film; and developing the light-exposed first film to obtain the first pattern.

In an embodiment, the first composition for radical polymerization has the same composition as defined for the composition for radical polymerization, above.

Applying the first composition for radical polymerization to the surface of the substrate may be performed by spin coating, dip coating, roll coating, screen coating, spray coating, flow coating, inkjet vapor jetting, drop casting, or blade coating, or a combination of these methods, but the method is not limited thereto. At least a portion of the solvent included in the first composition for radical polymerization applied to the substrate may be removed to obtain the first film. A heat treatment for the removal of the solvent may be performed at a temperature about 30 to about 300° C., specifically about 40 to about 120° C., although the heat treatment temperature ranges vary according to the solvent included in the first composition for radical polymerization. However, the heat treatment temperature is not limited thereto.

Next, the first film is irradiated with light having a first energy according to the first pattern to selectively expose the first film.

The first film may be selectively exposed to light in the presence of a photomask having a particular pattern (that is, according to the pattern of the photomask). In this case, crosslinking and/or curing reactions occur between photosensitive materials in a light-exposed portion, and thus a solubility difference between the light-exposed portion and a non-light-exposed portion occurs. Thus, the light-exposed and non-light-exposed portions are treated with a developing solution in a subsequent developing process to obtain the first pattern. The light exposure process may be performed by contact light exposure or non-contact light exposure, and a light exposure amount is not particularly limited and may be appropriately selected according to the desired thickness of the first film. For example, the light exposure amount may be in the range of about 50 millijoules per square centimeter (mJ/cm$^2$) to about 850 mJ/cm$^2$, but is not limited thereto. If the light exposure amount is insufficient, e.g., is less than about 50 mJ/cm$^2$, the ensuing crosslinking reaction may not be complete.

Alternatively, a 3-dimensional first pattern can be obtained using a laser beam as a light source, and a device which can induce two-photon polymerization in the light exposure process. For the formation of the 3-dimensional first pattern, the composition for radical polymerization may, as described above, further include the two photon absorption material.

A light exposure process for the two-photon polymerization may be performed using a commercial laser device operating at known wavelengths and by a known operation method thereof.

For example, the laser device may include two galvano mirrors which can focus a laser beam in a horizontal direction and the focus of a laser beam in a vertical direction, and a lens having an appropriate aperture ratio, through which the laser beam focused by the galvano mirrors is passed to reach the first film. The laser device may further include a camera for observing and confirming the fabrication process of the first pattern. In addition, an available wavelength of the laser beam may vary according to a component and size of a pattern to be formed, however, for example, a Ti:sapphire laser with a wavelength of 780 nm may be used. An irradiation time of the laser beam may be controlled by a galvano shutter and a pin hole, and may, for example, be controlled to an exposure time level of 10 ms.

As described above, the solubility difference between the light-exposed portion and the non-light-exposed portion of the first film that is selectively exposed to light according to the first pattern is obtained. Thus, the light-exposed first film is developed using an appropriate developing solution to obtain the first pattern. Exemplary developing solutions include, but are not limited to, an organic solvent, such as toluene, chloroform, and propylene glycol methyl ether acetone (PGMEA); a weakly acidic or weakly basic solution; and pure water.

In the forming of the pattern, when the radical scavenger described above is used as the material for adjusting the size of the pattern, the size of the pattern (for example, length and width in the x-y plane of the substrate on which the pattern is formed; height along the z-axis of the plane of the substrate; and/or diameter of the pattern) can be decreased. For example, a second composition for radical polymerization including a photosensitive material, a photoinitiator, and a solvent in the same ratio as that in the first composition for radical polymerization, except that the second composition does not include the radical scavenger, is applied on a surface of a substrate to obtain a second film with the same thickness as that of the first film, and the second film is irradiated with the light having a first energy and according to the first pattern, to selectively expose the second film to light and the light-exposed second film is developed to obtain a second pattern. Comparing the size of the first pattern with the size of the second pattern formed in this way, the size of the first pattern (for example, horizontal line, vertical line, height, thickness, width, and/or diameter of the first pattern) may be smaller than the size of the second pattern. This is because the radical scavenger in the second film prevents the diffusion of the radical during exposure to light.

Alternatively, when at least one selected from the group consisting of the polymer-containing radical scavenger described above, the photosensitizer, and a combination of these is used as the material for adjusting the size of the pattern of the first composition for radical polymerization, the size of the pattern may be increased. For example, a second composition for radical polymerization including a photosensitive material, a photoinitiator, and a solvent having components present in the same weight ratio as that of components in the first composition for radical polymerization, except that the second composition does not include the polymer-containing radical scavenger and/or the photosensitizer, is applied on a surface of a substrate to obtain a second film with the same thickness as that of the first film, and then the second film is irradiated with the light having a first energy according to the first pattern to selectively expose the second film, and the light-exposed second film is developed to obtain a second pattern. Comparing the size of the first pattern with the size of the second pattern, the size of the first pattern (for example, horizontal line, vertical line, height, thickness, width, and/or diameter of the first pattern) may be greater than the size of the second pattern. It is believed that the polymer-containing radical scavenger and the photosensitizer increase the diffusion of the radical to provide this effect.

The first pattern may have a two-dimensional or three-dimensional shape, and may have various additional shapes as required in a variety of devices requiring use of the first pattern.

The size of the first pattern may be about 1,000 micrometers or less, and specifically, about 100 micrometers or less. In an exemplary embodiment, the size of the first pattern may be about 10 micrometers or less. In another exemplary embodiment, the size of the first pattern may be about 1 micrometer or less.

According to the forming of the pattern, the composition for radical polymerization includes the material for adjusting the size of the pattern, and thus the size of the pattern may be readily decreased or increased. For example, the method of forming the pattern described above may be suitable for adjusting a size of a micropattern to about 1,000 micrometers or less.

EXAMPLE

Comparative Example 1

A combination of toluene as a solvent, 0.1 g of 2,2-diethoxyacetophenone as a photoinitiator, 0.01 g of Rodamine B as a two photon absorption material, and 5 g of SCR 500 (manufactured by JSR, Japan, urethaneacrylate) as a photosensitive material are mixed to prepare a composition. The composition is dropped on a glass substrate that was previously cleaned with isopropylalcohol ("IPA"), and spin-coated at 500 rpm for 5 seconds and at 3,000 rpm for 30 seconds. Then, the resultant is dried in a heating plate at 65° C. for 1 minute, and followed by heat treating on a heating plate at 95° C. for 15 minutes to remove the solvent to obtain a film.

Figure 1A:
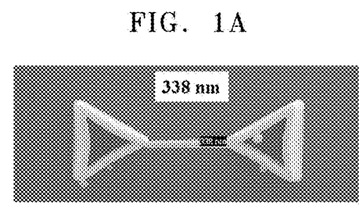
FIGS. 1A and 1B are top and side view scanning electron microscope ("SEM") images of a comparative pattern prepared in Comparative Example 1.
Figure 1B:
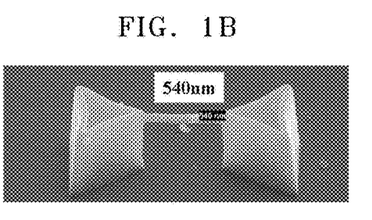

To form a three-dimensional pattern in the film, the x-axis and y-axis are controlled using a Ti:Sapphire laser with a wavelength of 780 nm (150 mW) and a Galvano scanner having a resolution of 1.2 nm. Two Galvano mirrors allowed laser beams projected in horizontal (x axis) and vertical (y-axis) directions relative to the stage to transmit through lens having a constant aperture ratio at an interval of 80 femtoseconds (fs) at a constant rate, and thus the laser beams were incident to the film. The control of a laser beam with respect to a z-axis direction was performed using a piezoelectric stage, and a deposition interval was controlled to a level of 10 nm. The irradiation time of the laser beam was controlled to a level of 1 ms in the combination of a Galvano shutter and a pinhole. The manufacturing process was monitored using a charge-coupled device ("CCD") camera equipped with a high magnification lens (1,000×). A three-dimensional image was prepared by continuously forming voxels according to a two-dimensional plane coordinate to prepare one layer, and then moving the piezoelectric stage in the z-axis direction to a distance which is the same as the deposition thickness to prepare another layer. After the curing process was terminated, the resultant was developed using propylene glycol methyl ether acetone (PGMEA), and then washed using IPA to obtain a three-dimensional pattern. FIGS. 1A and 1B each respectively show scanning electron microscope (SEM) images of the top and side of the pattern prepared in Comparative Example 1.

Example 1

Figure 2A:
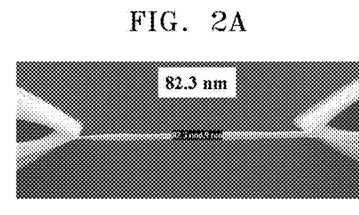
FIGS. 2A and 2B are top and side view SEM images of an exemplary pattern prepared in Example 1.
Figure 2B:
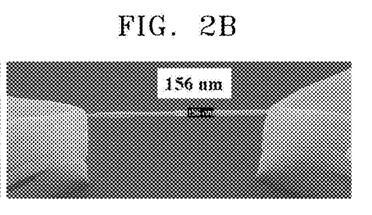

A pattern is prepared in the same manner as in Comparative Example 1, except that a 2,2,6,6-tetramethyl-1-piperidinyloxy (TEMPO) free radical (obtained from Sigma Aldrich) is added as a radical scavenger to the composition of Comparative Example 1, in an amount of 0.2 wt % based on 100 wt % of the composition. FIGS. 2A and 2B each respectively show SEM images of the top and side of the pattern prepared in Example 1.

Example 2

The same method as that used in Comparative Example 1 is performed in Example 2, except that a 2,2,6,6-tetramethyl-1-piperidinyloxy (TEMPO) free radical (obtained from Sigma Aldrich) is added as a radical scavenger to the composition of Comparative Example 1, and the amount of TEMPO was 0.8 wt % based on 100 wt % of the composition of Comparative Example 1. As a result, a pattern was not formed.

Referring to FIGS. 1A, 1B, 2A and 2B and from the result of Example 2 in which the pattern was not formed, it is seen that the size of the pattern can be decreased under the same laser energy conditions by using the radical scavenger as a material for adjusting the size of the pattern.

Comparative Example 2

Figure 3A:
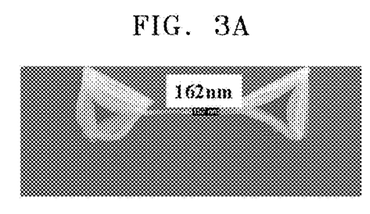
FIGS. 3A and 3B are top and side view SEM images of a comparative pattern prepared in Comparative Example 2.
Figure 3B:
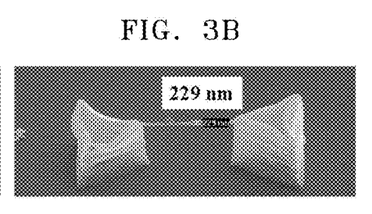

A pattern was prepared in the same manner as in Comparative Example 1, except that the energy of the Ti:Sapphire laser with a wavelength of 780 nm is controlled to 100 mW instead of 150 mW. FIGS. 3A and 3B respectively show images of the top and side of the pattern prepared Comparative Example 2.

Example 3

Figure 4A:
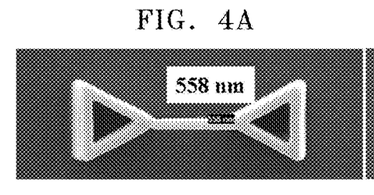
FIGS. 4A and 4B are top and side view SEM images of an exemplary pattern prepared in Example 2.
Figure 4B:
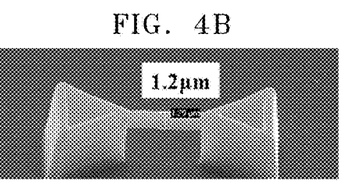

A pattern was prepared in the same manner as in Comparative Example 2, except that a 2,2,6,6-tetramethyl-1-piperidinyloxy (TEMPO) free radical combined with polystyrene (obtained from Sigma-Aldrich), is added as a radical scavenger to the composition of Comparative Example 2, and the amount of TEMPO combined with polystyrene was 0.2 wt % based on 100 wt % of the composition. FIGS. 4A and 4B each respectively show SEM images of the top and side of the pattern prepared in Example 3.

Example 4

Figure 5A:
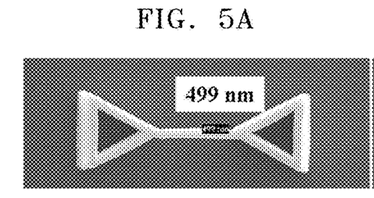
FIGS. 5A and 5B are top and side view SEM images of an exemplary pattern prepared in Example 4.
Figure 5B:
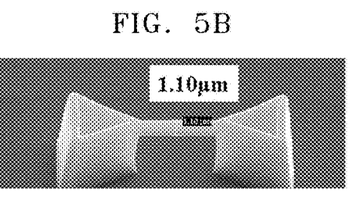

A pattern was prepared in the same manner as in Comparative Example 2, except that a 2,2,6,6-tetramethyl-1-piperidinyloxy (TEMPO) free radical combined with polystyrene (obtained from Sigma-Aldrich), is added as a radical scavenger to the composition of Comparative Example 2, to afford the same as used in Example 3, but where the amount of the TEMPO combined with polystyrene was 0.4 wt % based on 100 wt % of the composition. FIGS. 5A and 5B each respectively show SEM images of the top and side of the pattern prepared in Example 4.

Example 5

Figure 6A:
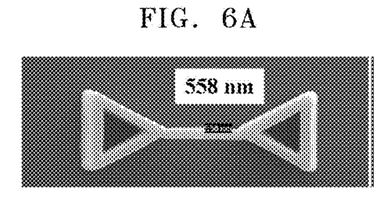
FIGS. 6A and 6B are top and side view SEM images of an exemplary pattern prepared in Example 5.
Figure 6B:
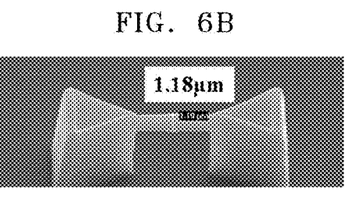

A pattern was prepared in the same manner as in Comparative Example 2, except that a 2,2,6,6-tetramethyl-1-piperidinyloxy (TEMPO) free radical combined with polystyrene (obtained from Sigma Aldrich), is added as a radical scavenger to the composition of Comparative Example 2, to afford the same product as used in Example 3, but where the amount of the TEMPO combined with polystyrene was 0.8 wt % based on 100 wt % of the composition. FIGS. 6A and 6B each respectively show SEM images of the top and side of the pattern prepared in Example 5.

Referring to FIGS. 3A through 6B, it is seen that the size of the pattern can be increased under the same laser energy conditions by using the polymer-containing radical scavenger as a material for adjusting the size of the pattern.

Example 6

Figure 7A:
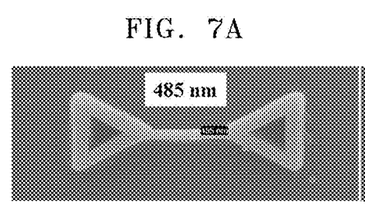
FIGS. 7A and 7B are top and side view SEM images of an exemplary pattern prepared in Example 6.
Figure 7B:
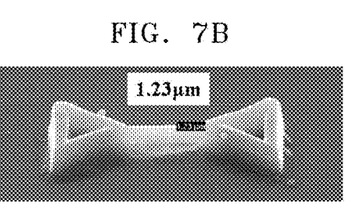

A pattern is prepared in the same manner as in Comparative Example 2, except that Michler's Ketone is added as a photosensitizer to the composition of Comparative Example 2, where the amount of Michler's Ketone is 0.2 wt % based on 100 wt % of the composition. FIGS. 7A and 7B each respectively show SEM images of the top and side of the pattern prepared in Example 6.

Example 7

Figure 8A:
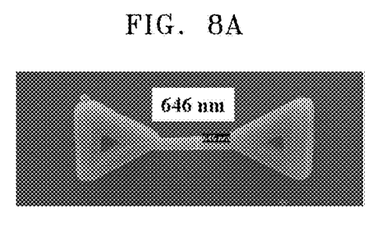
FIGS. 8A and 8B are top and side view SEM images of an exemplary pattern prepared in Example 7.
Figure 8B:
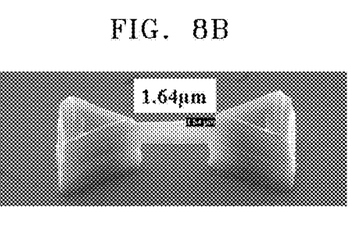

A pattern is prepared in the same manner as in Comparative Example 2, except that Michler's Ketone is added as a photosensitizer to the composition of Comparative Example 2, where the amount of Michler's Ketone is 0.4 wt % based on 100 wt % of the composition. FIGS. 8A and 8B each respectively show SEM images of the top and side of the pattern prepared in Example 7.

Example 8

Figure 9A:
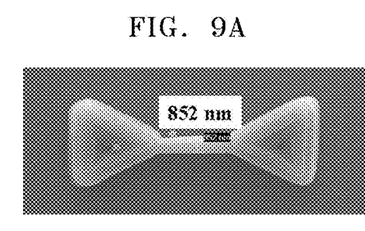
FIGS. 9A and 9B are top and side view SEM images of an exemplary pattern prepared in Example 8.
Figure 9B:
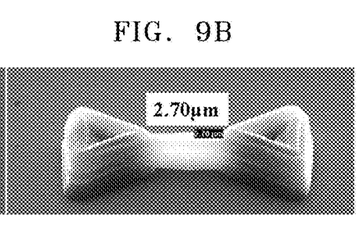

A pattern is prepared in the same manner as in Comparative Example 2, except that Michler's Ketone is added as a photosensitizer to the composition of Comparative Example 2, where the amount of Michler's Ketone is 0.8 wt % based on 100 wt % of the composition. FIGS. 9A and 9B each respectively show SEM images of the top and side of the pattern prepared in Example 8.

Referring to FIGS. 3A and 3B and 7A through 9B, it is seen that the size of the pattern can be increased under the same laser energy conditions, but by using the photosensitizer as a material for adjusting the size of the pattern.

Evaluation Example

Figure 10:
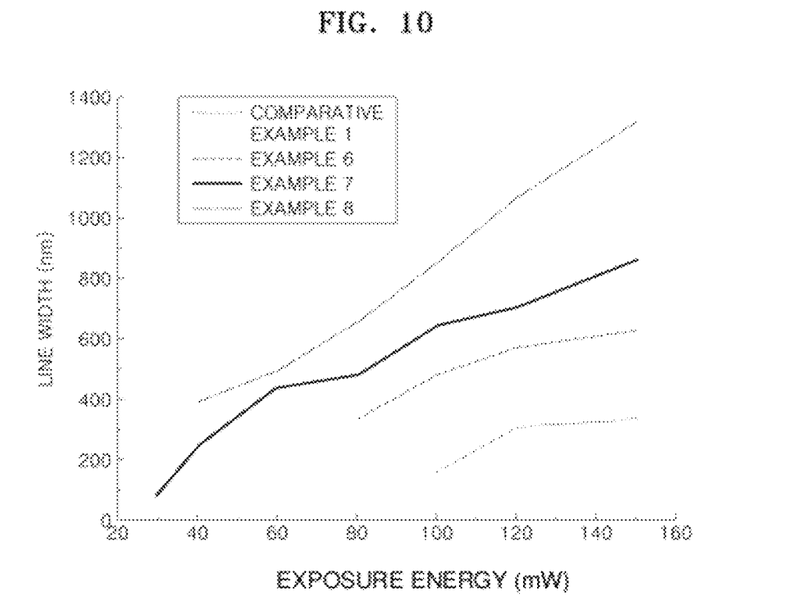
FIG. 10 is a graph showing a plot of line width sizes of patterns (in nm) versus exposure energy (in mW) obtained when changing light exposure energy for compositions prepared in Comparative Example 1 and Examples 6 through 8.

The compositions of Comparative Example 1 (excluding the photosensitizer), Example 6 (including Michler's Ketone as the photosensitizer, the amount therein being 0.2 wt % based on 100 wt % of the composition), Example 7 (including Michler's Ketone as the photosensitizer, the amount therein being 0.4 wt % based on 100 wt % of the composition), and Example 8 (including Michler's Ketone as the photosensitizer, the amount therein being 0.8 wt % based on 100 wt % of the composition) were each respectively exposed to a light with energies of the light of 20 mW, 30 mW, 40 mW, 60 mW, 80 mW, 100 mW, 120 mW, and 150 mW, to form patterns. The size of each of the patterns was measured. Referring to FIGS. 1A through 9B, the patterns formed each have a shape of a central stripe-type bar having a triangle at each end thereof, and the line width of the bar is used to represent the size of the pattern. The results are shown in FIG. 10. Referring to FIG. 10, which shows a plot of line width (in nm) versus exposure energy (in milliwatts), it can be seen that the size of the pattern (particularly, line width) can be increased under the same energy conditions of the light beam by increasing the amount of the photosensitizer present.

The sizes of the patterns obtained by adjusting the energy of the light beam to 100 mW, 120 mW, and 150 mW are shown in Table 1 below.

TABLE 1

|  | 100 mW | 120 mW | 150 mW |
| --- | --- | --- | --- |
| Composition of Comparative Example 1 (excluding photosensitizer) | 162 nm | 309 nm (+147 nm)[a] | 338 nm (+176 nm)[a] |
| Composition of Example 6 (including 0.2 wt % of Michler's Ketone based on 100 wt % of the composition as a photosensitizer) | 485 nm (+323 nm)[a] | 573 nm (+264 nm)[b] | 632 nm (+294 nm)[c] |
| Composition of Example 7 (including 0.4 wt % of Michler's Ketone based on 100 wt % of the composition as a photosensitizer) | 646 nm (+484 nm)[a] | 705 nm (+396 nm)[b] | 867 nm (+529 nm)[c] |
| Composition of Example 8 (including 0.8 wt % of Michler's Ketone based on 100 wt % of the composition as a photosensitizer) | 852 nm (+690 nm)[a] | 1070 nm (+761 nm)[b] | 1320 nm (+982 nm)[c] |

TABLE 1-continued

|  | 100 mW | 120 mW | 150 mW |
| --- | --- | --- | --- |

[a]Value in parentheses is the increase in linewidth over linewidth of Comparative Example 1 at 100 mW exposure energy.
[b]Value in parentheses is the increase in linewidth over linewidth of Comparative Example 1 at 120 mW exposure energy.
[c]Value in parentheses is the increase in linewidth over linewidth of Comparative Example 1 at 150 mW exposure energy.

As described above, according to the one or more of the above embodiments, a size (e.g., line width) of a pattern may be adjusted readily and simply by controlling components of a composition for radical polymerization.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:
1. A method of forming a pattern, comprising:
preparing a first composition for radical polymerization including a photosensitive material, a photoinitiator comprising an acetophenone-based, benzoin-based, benzophenone-based, or thioxanthenone-based photoinitiator, or any combination thereof, a solvent, and a material for adjusting a size of a pattern, wherein the material for adjusting the size of a pattern is a radical scavenger;
applying the first composition for radical polymerization to a surface of a substrate to form a first film;
irradiating the first film with light having a first energy according to a first pattern to selectively expose the first film; and
developing the light-exposed first film to obtain the first pattern,
wherein the size of the first pattern is adjusted to be smaller than the size of a second pattern, wherein the second pattern is obtained by applying, to a surface of a substrate, a second composition for radical polymerization including a photosensitive material, a photoinitiator, and a solvent in a same weight ratio as corresponding components in the first composition for radical polymerization, to obtain a second film with a thickness the same as that of the first film, then irradiating the second film with light having a first energy according to the first pattern to selectively expose the second film to light and developing the light-exposed second film, to form a second pattern.

2. The method of claim 1, wherein the radical scavenger is selected from the group consisting of 2,2,6,6-tetramethyl-1-piperidinyloxy free radical represented by Formula 1 below; isoprene; diisobutylene; α-tocopherol, β-tocopherol, γ-tocopherol, δ-tocopherol; 4,6-bis(octylthiomethyl)-o-cresol; 4,6-bis(dodecylthiomethyl)-o-cresol; 4,4'-thiobis(2-methyl-6-t-butylphenol), 4,4'-thiobis(2-t-butyl-5-methylphenol); 2,2'-thiobis(6-t-butyl-4 methylphenol); 2,2'-thiobis 4-octyl phenol; 4,4'-thiobis(2-t-butyl-5-methylphenol), triethylene glycol bis[3-[3,5-t-butyl-4-hydroxy-5-methylphenyl)propionate; 1,3,5-tris(4-tert-butyl-3-hydroxy-2,6-dimethylbenzyl)-1,3,5-triazine-2,4,6-(1H,3H,5H)-trione; 2,5-di-t-amyl-hydroquinone; a reaction product of 4-methylphenol with dicyclopentadiene and isobutylene; oxidized bis(hydrogenated tallow alkyl)amine; bis-(1-octyloxy-2,2,6,6 tetramethyl-4-piperidinyl)sebacate; 4,4'-bis(α,α-dimethylbenzyl)

diphenylamine, N-phenyl-styrenated benzenamine, a reaction product of diphenylamine and acetone, p-(p-toluenesulfonyl amido)-diphenylamine; 2,2-thiodiethylene bis[3(3-t-butyl-4-hydroxy-5 methylphenyl)propionate]; 2,2-thiodiethylene bis[3(3,5-di-methyl-4-hydroxyphenyl)propionate]; galvinoxyl free radical represented by Formula 2 below, derivatives thereof, and mixtures thereof:

Formula 1

Formula 2

3. A method of forming a pattern, comprising:
preparing a first composition for radical polymerization including a photosensitive material, a photoinitiator comprising an acetophenone-based, benzoin-based, benzophenone-based, or thioxanthenone-based photoinitiator, or any combination thereof, a solvent, and a material for adjusting a size of a pattern, wherein the material for adjusting the size of a pattern is a polymer containing radical scavenger;
applying the first composition for radical polymerization to a surface of a substrate to form a first film;
irradiating the first film with light having a first energy according to a first pattern to selectively expose the first film; and
developing the light-exposed first film to obtain the first pattern, wherein the size of the first pattern is adjusted to be larger than a size of a second pattern, wherein the second pattern is obtained by applying, to a surface of a substrate, a second composition for radical polymerization comprising a photosensitive material, a photoinitiator, and a solvent, wherein each of these components is present in the same weight ratio as corresponding components in the first composition for radical polymerization, to obtain a second film with the same thickness as that of the first film, then irradiating the second film with light having a first energy according to the first pattern to selectively expose the second film; and developing the light-exposed second film to obtain a second pattern.

4. The method of claim 3, wherein a polymer of the polymer-containing radical scavenger is selected from the group consisting of polystyrene, poly(methyl)methacrylate, polymethacrylate, poly(methyl)acrylate, polyacrylate, derivatives thereof, and any combination thereof.

5. The method of claim 1, wherein the first composition for radical polymerization further comprises a quantum dot, and the first pattern comprises the quantum dot.

6. The method of claim 1, wherein the first composition for radical polymerization further comprises a two photon absorption material.

7. The method of claim 1, wherein the irradiating is performed using a laser beam which induces two-photon absorption, and the first pattern has a three-dimensional form.

8. The method of claim 1, wherein the size of the first pattern is about 1,000 micrometers or less.

9. The method of claim 3, wherein the first composition for radical polymerization further comprises a quantum dot, and the first pattern comprises the quantum dot.

10. The method of claim 3, wherein the first composition for radical polymerization further comprises a two photon absorption material.

11. The method of claim 3, wherein the irradiating is performed using a laser beam which induces two-photon absorption, and the first pattern has a three-dimensional form.

12. The method of claim 3, wherein the size of the first pattern is about 1,000 micrometers or less.

* * * * *